United States Patent
Matsukura et al.

(10) Patent No.: US 10,944,026 B2
(45) Date of Patent: Mar. 9, 2021

(54) SEMICONDUCTOR LIGHT EMITTING DEVICE AND METHOD OF MANUFACTURING SEMICONDUCTOR LIGHT EMITTING DEVICE

(71) Applicant: NIKKISO CO., LTD., Tokyo (JP)

(72) Inventors: Yusuke Matsukura, Hakusan Ishikawa (JP); Cyril Pernot, Hakusan Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 16/526,044

(22) Filed: Jul. 30, 2019

(65) Prior Publication Data
US 2019/0355872 A1 Nov. 21, 2019

Related U.S. Application Data

(63) Continuation of application No. PCT/JP2018/000479, filed on Jan. 11, 2018.

(30) Foreign Application Priority Data

Feb. 1, 2017 (JP) ............................. JP2017-016858

(51) Int. Cl.
| | |
|---|---|
| *H01L 33/12* | (2010.01) |
| *H01L 33/00* | (2010.01) |
| *H01L 33/02* | (2010.01) |
| *H01L 33/06* | (2010.01) |
| *H01L 33/14* | (2010.01) |
| *H01L 33/32* | (2010.01) |

(52) U.S. Cl.
CPC ............ *H01L 33/12* (2013.01); *H01L 33/007* (2013.01); *H01L 33/025* (2013.01); *H01L 33/06* (2013.01); *H01L 33/145* (2013.01); *H01L 33/325* (2013.01)

(58) Field of Classification Search
CPC ..... H01L 33/12; H01L 33/007; H01L 33/025; H01L 33/06; H01L 33/145; H01L 33/325; H01L 21/205
USPC ........................................................ 438/46
See application file for complete search history.

(56) References Cited

U.S. PATENT DOCUMENTS

| | | | |
|---|---|---|---|
| 8,357,924 B2 * | 1/2013 | Kim | H01L 33/007 257/13 |
| 2015/0048304 A1 * | 2/2015 | Niwa | H01L 33/0095 257/13 |
| 2015/0349197 A1 | 12/2015 | Watanabe et al. | |

FOREIGN PATENT DOCUMENTS

| | | |
|---|---|---|
| CN | 104919604 A | 9/2015 |
| JP | 2010205767 A | 9/2010 |

(Continued)

OTHER PUBLICATIONS

Decision to Dismiss the Amendment based on corresponding Application No. 2017-016858; dated Oct. 29, 2019.

(Continued)

*Primary Examiner* — Vu A Vu
(74) *Attorney, Agent, or Firm* — Muncy, Geissler, Olds & Lowe, P.C.

(57) ABSTRACT

A semiconductor light emitting device includes: an n-type clad layer made of an n-type aluminum gallium nitride (AlGaN)-based semiconductor material containing silicon (Si); an intermediate layer provided on the n-type clad layer and containing Si; an active layer of an AlGaN-based semiconductor material provided on the intermediate layer; and a p-type semiconductor layer provided on the active layer. A distribution of an Si concentration in a direction in which the n-type clad layer, the intermediate layer, and the active layer are stacked has a local peak at least at a position of the intermediate layer.

6 Claims, 2 Drawing Sheets

(56) References Cited

FOREIGN PATENT DOCUMENTS

| JP | 2013122950 A | 6/2013 |
|----|--------------|--------|
| JP | 2016066691 A | 4/2016 |
| WO | WO 2008/117788 A1 | 10/2008 |
| WO | WO 2014/178248 A1 | 11/2014 |
| WO | WO 2016/047386 A1 | 3/2016 |

OTHER PUBLICATIONS

Decision of Refusal based on corresponding Application No. 2017-016858; dated Oct. 29, 2019.
International Search Report for the corresponding PCT Application No. PCT/JP2018/000479 with English translation; pp. 1-5.
Written Opinion of ISA with an English translation; pp. 1-10.
Written Opinion of IPEA with an English translation; pp. 1-16.
International Preliminary Examination Report on Patentability (II) with an English translation and the cited reference(s) with an English abstract; pp. 1-16.
Office Action dated Mar. 20, 2018 for the corresponding Japanese Patent Application No. 2017-016858 with English translation; pp. 1-7.
Office Action dated Jan. 8, 2019 for the corresponding Japanese Patent Application No. 2017-016858 with English translation; pp. 1-7.
Office Action dated Apr. 23, 2019 for the corresponding Japanese Patent Application No. 2017-016858 with English translation; pp. 1-7.
Office Action dated Jan. 31, 2019 for the corresponding Taiwanese Patent Application No. 107102209 with English translation; pp. 1-9.

\* cited by examiner

SEMICONDUCTOR LIGHT EMITTING DEVICE AND METHOD OF MANUFACTURING SEMICONDUCTOR LIGHT EMITTING DEVICE

RELATED APPLICATION

Priority is claimed to Japanese Patent Application No. 2017-016858, filed on Feb. 1, 2017, the entire content of which is incorporated herein by reference.

BACKGROUND OF THE INVENTION

1. Field of the Invention

The present invention relates to a semiconductor light emitting device and a method of manufacturing a semiconductor light emitting device.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have therefore attracted attention as a mercury free sterilization light source in medical and food processing fields. A light emitting device for emitting deep ultraviolet light includes an aluminum gallium nitride (AlGaN) based n-type clad layer, active layer, p-type clad layer, etc. stacked successively on a substrate. It is proposed that an aluminum nitride (AlN) electron block layer be formed between the active layer and the p-type semiconductor layer for improvement of light output.

Further improvement of light output is called for in semiconductor light emitting devices for emitting deep ultraviolet light.

SUMMARY OF THE INVENTION

In this background, one illustrative purpose of the present invention is to provide a technology of improving the light output of a semiconductor light emitting device.

A semiconductor light emitting device according to an embodiment of the present invention includes: an n-type clad layer made of an n-type aluminum gallium nitride (AlGaN)-based semiconductor material containing silicon (Si); an intermediate layer provided on the n-type clad layer and containing Si; an active layer of an AlGaN-based semiconductor material provided on the intermediate layer; and a p-type semiconductor layer provided on the active layer. A distribution of an Si concentration in a direction in which the n-type clad layer, the intermediate layer, and the active layer are stacked has a local peak at least at a position of the intermediate layer.

According to this embodiment, the light output of the light emitting device is increased by providing the intermediate layer such that the Si concentration distribution has a peak between the n-type clad layer and the active layer.

The intermediate layer may include at least silicon (Si), aluminum (Al), and nitrogen (N).

The intermediate layer may include the first intermediate layer and the second intermediate layer having an Si concentration higher than that of the first intermediate layer.

The first intermediate layer may be provided on the n-type clad layer, the second intermediate layer may be provided on the first intermediate layer, and the active layer may be provided on the second intermediate layer.

The first intermediate layer may be made of an AlGaN-based semiconductor material, and the second intermediate layer may be made of an AlGaN-based semiconductor material having a molar fraction of aluminum nitride (AlN) lower than that of the first intermediate layer.

The peak Si concentration in the intermediate layer may be higher than the Si concentration in the n-type clad layer.

The peak Si concentration in the intermediate layer may be higher than the Si concentration in the active layer and lower than the maximum value of the Si concentration in the n-type clad layer.

The peak Si concentration in the intermediate layer may be not lower than $8\times10^{18}/cm^3$ and not higher than $2.2\times10^{19}/cm^3$.

Another embodiment of the present invention relates to a method of manufacturing a semiconductor light emitting device. The method includes: forming, on a substrate, an n-type clad layer made of an n-type aluminum gallium nitride (AlGaN)-based semiconductor material containing silicon (Si); forming an intermediate layer containing Si on the n-type clad layer; forming an active layer of an AlGaN-based semiconductor material on the intermediate layer; and forming a p-type semiconductor layer on the active layer. A substrate temperature in the forming of the intermediate layer is lower than a substrate temperature in the forming of the n-type clad layer.

According to this embodiment, the light output of the light emitting device is increased by providing the intermediate layer containing Si between the n-type clad layer and the active layer. By configuring the growth temperature of the intermediate layer to be lower than the growth temperature of the n-type clad layer, the wettability at the interface occurring when the intermediate layer is formed is improved, the interface energy is lowered accordingly, and the propagation of threading dislocation to the active layer is inhibited. This enhances the crystal quality of the active layer and inhibits the light output from dropping by dislocation.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
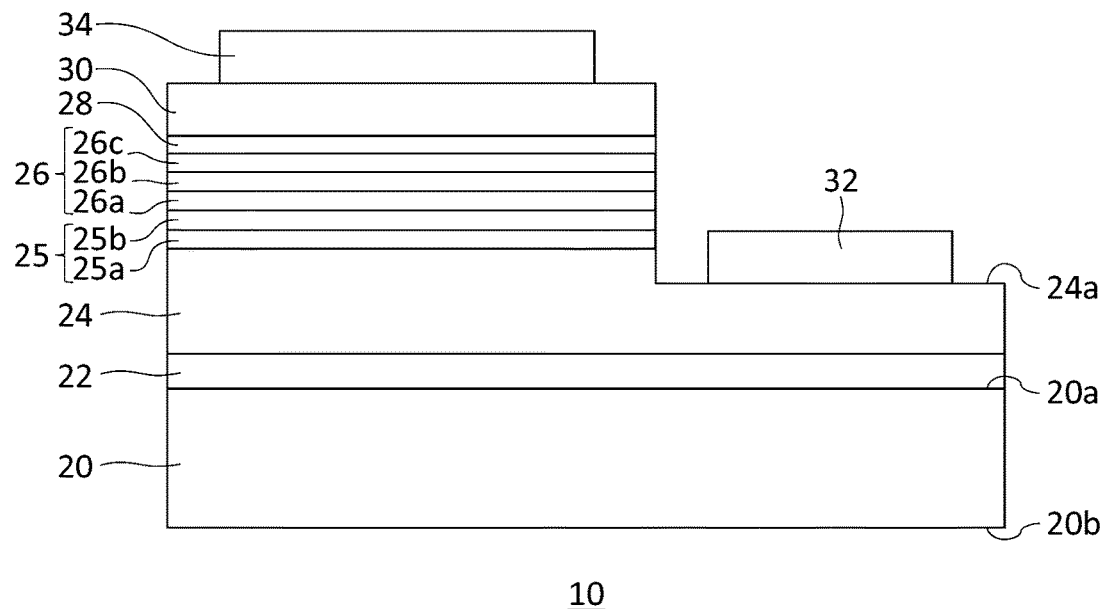
FIG. 1 is a cross-sectional view schematically showing a configuration of a semiconductor light emitting device according to the embodiment.

The invention will now be described by reference to the preferred embodiments. This does not intend to limit the scope of the present invention, but to exemplify the invention.

A detailed description will be given of embodiments to practice the present invention with reference to the drawings. Like numerals are used in the description to denote like elements and a duplicate description is omitted as appropriate. To facilitate the understanding, the relative dimensions of the constituting elements in the drawings do not necessarily mirror the relative dimensions in the actual apparatus.

FIG. 1 is a cross-sectional view schematically showing a configuration of a semiconductor light emitting device 10 according to the embodiment. The semiconductor light emitting device 10 is a light emitting diode (LED) chip configured to emit "deep ultraviolet light" having a central wavelength λ of about 360 nm or lower. To output deep ultraviolet light having such a wavelength, the semiconductor light emitting device 10 is made of an aluminum gallium nitride (AlGaN)-based semiconductor material having a band gap of about 3.4 eV or larger. The embodiment particularly discusses a case of emitting deep ultraviolet light having a central wavelength λ of about 240 nm-350 nm.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light emitting device 10 includes a substrate 20, a buffer layer 22, an n-type clad layer 24, an intermediate layer 25, an active layer 26, an electron block layer 28, a p-type clad layer 30, an n-side electrode 32, and a p-side electrode 34.

The substrate 20 is a substrate having translucency for the deep ultraviolet light emitted by the semiconductor light emitting device 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the buffer layer 22 and the layers above. The second principal surface 20b is a principal surface that is a light extraction substrate for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer gown at a high temperature. The buffer layer 22 may include an undoped AlGaN layer formed on the AlN layer. In one variation, the buffer layer 22 may be formed only by an undoped AlGaN layer when the substrate 20 is an AlN substrate or an AlGaN substrate. In other words, the buffer layer 22 includes at least one of an undoped AlN layer and an AlGaN layer.

The n-type clad layer 24 is formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 20% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 μm-3 μm. For example, the n-type clad layer 24 has a thickness of about 2 μm.

The n-type clad layer 24 is formed such that the concentration of silicon (Si) as the impurity is not lower than $1 \times 10^{18}/cm^3$ and not higher than $5 \times 10^{19}/cm^3$. It is preferred that to form the n-type clad layer 24 such that the Si concentration is not lower than $5 \times 10^{18}/cm^3$ and not higher than $3 \times 10^{19}/cm^3$, and it is preferred to form it such that the Si concentration is not lower than $7 \times 10^{18}/cm^3$ and not higher than $2 \times 10^{19}/cm^3$. In one example, the Si concentration in the n-type clad layer 24 is around $1 \times 10^{19}/cm^3$ and is in a range not lower than $8 \times 10^{18}/cm^3$ and not higher than $5 \times 10^{19}/cm^3$.

The intermediate layer 25 is formed on the n-type clad layer 24. The intermediate layer 25 is a layer that contains aluminum (Al) and nitrogen (N) and is exemplified by an AlN-based semiconductor material or an AlGaN-based semiconductor doped with Si as an impurity. The intermediate layer 25 has a thickness of about 1 nm-100 nm. For example, the intermediate layer 25 has a thickness of 1 nm, 2 nm, 3 nm, 5 nm, 10 nm, or 20 nm.

The intermediate layer 25 may be a monolayer or may be a multilayer structure. In the case the intermediate layer 25 is a multilayer structure, the intermediate layer 25 is comprised of a stack of a plurality of layers that differ in the Si concentration or the AlN composition ratio. For example, the intermediate layer 25 includes a first intermediate layer 25a having a relatively low Si concentration and a second intermediate layer 25b having a relatively high Si concentration. The first intermediate layer 25a is provided on the n-type clad layer 24, and the second intermediate layer 25b is provided on the first intermediate layer 25a. The intermediate layer 25 may be comprised of a multilayer structure of three or more layers. For example, the intermediate layer 25 may be comprised of a stack in which the first intermediate layer and the second intermediate layer are alternately stacked.

In the case the intermediate layer 25 is a multilayer structure, the Si concentration in the first intermediate layer 25s is at least higher than the Si concentration in the active layer 26 and lower than the Si concentration in the n-type clad layer 24. The Si concentration in the second intermediate layer 25b is higher than the Si density of the first intermediate layer 25a. The Si concentration in the second intermediate layer 25b may be higher or lower than the Si concentration in the n-type clad layer 24. The AlN molar fraction in the first intermediate layer 25a may be higher than the AlN molar fraction in the second intermediate layer 25b.

The active layer 26 is made of an AlGaN-based semiconductor material and has a double heterojunction structure by being sandwiched by the intermediate layer 25 and the electron block layer 28. The active layer 26 may have a monolayer or multilayer quantum well structure. For example, the active layer 26 may be formed by stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter.

For example, the active layer 26 includes a first well layer 26a, a barrier layer 26b, and a second well layer 26c. The first well layer 26a is provided between the intermediate layer 25 and the barrier layer 26b, and the second well layer 26c is provided between the barrier layer 26b and the electron block layer 28. The first well layer 26a and the second well layer 26c have a lower AlN molar fraction ratio than the barrier layer 26b.

The electron block layer 28 is formed on the active layer 26. The electron block layer 28 is a p-type AlGaN-based semiconductor material layer and is formed such that the molar fraction of AlN is 40% or higher, and, preferably, 50% or higher. The electron block layer 28 may be formed such that the molar fraction of AlN is 80% or higher or may be made of an AlN-based semiconductor material that does not substantially contain GaN. The electron block layer has a thickness of about 1 nm-10 nm. For example, the electron block layer has a thickness of about 2 nm-5 nm. The electron block layer 28 may not be a p-type layer and may be an undoped semiconductor layer.

The p-type clad layer 30 is a p-type semiconductor layer formed on the electron block layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed in a partial region on the n-type clad layer 24. The n-side electrode 32 is formed by a multilayer film in which titanium (Ti)/aluminum (Al)/Ti/gold (Au) are layered on the n-type clad layer 24 successively. The p-side electrode 34 is formed on the p-type clad layer 30. The p-side electrode 34 is formed by a nickel (Ni)/gold (Au) multilayer film built on the p-type clad layer 30 successively.

A description will now be given of a method of manufacturing the semiconductor light emitting device 10. First, the substrate 20 is prepared, and the buffer layer 22, the n-type clad layer 24, the intermediate layer 25, the active layer 26, the electron block layer 28, and the p-type clad layer 30 are successively formed on the first principal surface 20a of the substrate 20.

The substrate 20 is a sapphire ($Al_2O_3$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer gown at a high temperature and an undoped AlGaN (u-AlGaN) layer. The n-type clad layer 24, the active layer 26, the electron block layer 28, and the p-type clad layer 30 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxy (MBE) method.

The intermediate layer 25 can be formed by a well-known epitaxial growth method such as the metalorganic vapor phase epitaxy (MOVPE) method and the molecular beam epitaxy (MBE) method, using at least tetramethylsilane ($Si(CH_3)_4$) or silane ($SiH_4$) as a stock gas. The intermediate layer 25 is formed by using, for example, tetramethylsilane ($Si(CH_3)_4$), trimethylaluminum (TMA; $(CH_3)_3Al$), and ammonia (NH3) as stock gases. Trimethylgallium (TMG; $CH_3)_3Ga$) may also be used as a stock gas to form the intermediate layer 25. By using these stock gases, a silicon-doped aluminum nitride (AlN) layer or a silicon-doped aluminum gallium nitride (AlGaN) layer is formed as the intermediate layer 25.

It is preferred that the intermediate layer 25 be formed at a temperature lower than the temperature at which the n-type clad layer 24 is formed. Given that the n-type clad layer 24 is formed at a 950° C.-1200° C., for example, it is preferred that the intermediate layer 25 be formed at 900° C.-1100° C. By forming the intermediate layer 25 at a temperature lower than the temperature at which the n-type clad layer 24 is formed, the wettability at the interface occurring when the intermediate layer 25 is formed is improved, the interface energy is lowered accordingly, and the propagation of threading dislocation to the active layer 26 is inhibited. This enhances the crystal quality of the active layer 26 and inhibits the light output from dropping by dislocation.

Subsequently, a mask is formed on the p-type clad layer 30, and the intermediate layer 25, the active layer 26, the electron block layer 28, and the p-type clad layer 30 in the exposed region 38, in which the mask is not formed, are removed. The intermediate layer 25, the active layer 26, the electron block layer 28, and the p-type clad layer 30 may be removed by plasma etching. Finally, the n-side electrode 32 is formed on the exposed surface 24a of the n-type clad layer 24, and the p-side electrode 34 is formed on the p-type clad layer 30 with the mask removed. The n-side electrode 32 and the p-side electrode 34 may be formed by a well-known method such as electron beam deposition and sputtering. This completes the semiconductor light emitting device 10 shown in FIG. 1.

Figure 2:
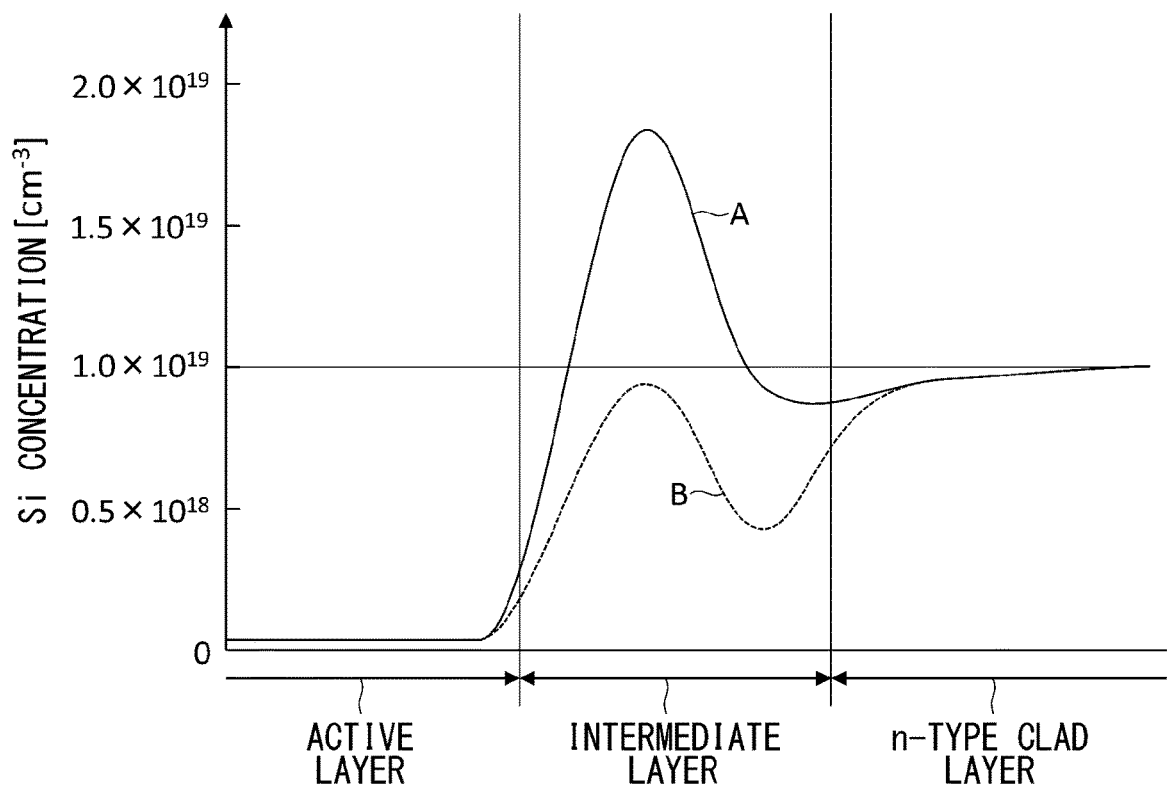
FIG. 2 is a graph schematically showing a silicon (Si) concentration distribution in the semiconductor light emitting device.

FIG. 2 is a graph schematically showing a silicon concentration distribution in the semiconductor light emitting device 10 and shows an SIMS profile of the n-type clad layer 24, the intermediate layer 25, and the active layer 26. In the illustrated example, the Si concentration in the n-type clad layer 24 is about $1 \times 10^{19}/cm^3$. Graph A shows a case where the local peak of the Si concentration in the intermediate layer 25 is higher than that of the n-type clad layer 24. Graph B shows a case where the local peak of the Si concentration in the intermediate layer 25 is lower than that of the n-type clad layer 24. In the case of graph B, there is a valley in the Si concentration that extends from the n-type clad layer 24 to the intermediate layer 25. The Si concentration drops once and then rises toward the local peak. The position of the valley in the Si concentration corresponds to the first intermediate layer 25a, and the position of the peak of the Si concentration corresponds to the second intermediate layer 25b. In either of graph A or graph B Si concentration distribution, the light output of the semiconductor light emitting device 10 can be increased by providing the intermediate layer 25 having a local peak in the Si concentration.

A description will now be given of examples according to the embodiment. In each example, the Si concentration in the n-type clad layer 24 is configured to be about $8 \times 10^{18}/cm^3$-$1.5 \times 10^{19}/cm^3$ and the peak value of the Si concentration in the intermediate layer 25 is made to vary from one example to another.

In example 1, the peak value of the Si concentration in the intermediate layer 25 is $4.9 \times 10^{19}/cm^3$, and the wavelength of emitted light of 280 nm and the light output of 1 mW are obtained. In example 2, the peak value of the Si concentration in the intermediate layer 25 is $1.8 \times 10^{19}/cm^3$, and the wavelength of emitted light of 284 nm and the light output of 6.4 mW are obtained. In example 3, the peak value of the Si concentration in the intermediate layer 25 is $1.0 \times 10^{19}/cm^3$, and the wavelength of emitted light of 180 nm and the light output of 6.5 mW are obtained. In example 4, the peak value of the Si concentration in the intermediate layer 25 is $0.8 \times 10^{19}/cm^3$, and the wavelength of emitted light of 280 nm and the light output of 5.5 mW are obtained. Examples 1 and 2 show an Si concentration distribution of a shape similar to graph A of FIG. 2, and examples 3 and 4 show an Si concentration distribution of a shape similar to graph B of FIG. 2. An intermediate layer that does not substantially contain Si was formed as a comparative example, and the Si concentration in the intermediate layer is configured to be $5 \times 10^{17}/cm^3$. In the comparative example, light emission was not identified substantively.

Figure 3:
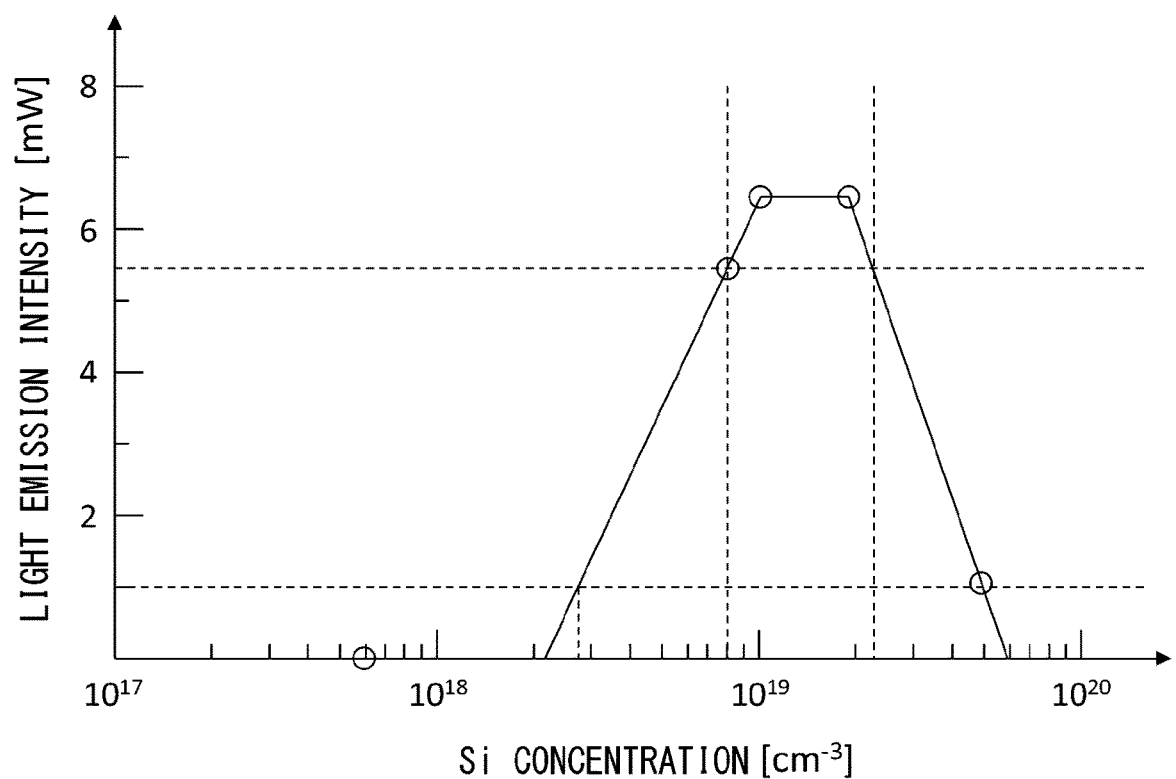
FIG. 3 is a graph showing a relationship between the peak value of the Si concentration in the intermediate layer and the light output of the semiconductor light emitting device.

FIG. 3 is a graph showing a relationship between the peak value of the Si concentration in the intermediate layer 25 and the light output and summarizes the relationship between the Si concentration and the light output in the examples and the comparative example. The graph shows that the light output of 1 mW or higher is obtained by configuring the peak value of the Si concentration in the intermediate layer 25 to be not smaller than $3 \times 10^{18}/cm^3$ and not larger than $5 \times 10^{19}$ $cm^3$. The graph also shows that the light output of 5.5 mW or higher is obtained by configuring the peak value of the Si concentration in the intermediate layer 25 to be not smaller than $8 \times 10^{18}/cm^3$ and not larger than $2.2 \times 10^{19}$ $cm^3$.

Described above is an explanation based on an exemplary embodiment. The embodiment is intended to be illustrative only and it will be understood by those skilled in the art that various design changes are possible and various modifications are possible and that such modifications are also within the scope of the present invention.

It should be understood that the invention is not limited to the above-described embodiment, but may be modified into various forms on the basis of the spirit of the invention. Additionally, the modifications are included in the scope of the invention.

What is claimed is:

1. A semiconductor light emitting device comprising:
    an n-type clad layer made of an n-type aluminum gallium nitride (AlGaN)-based semiconductor material containing silicon (Si) and having a molar fraction of aluminum nitride (AlN) of not lower than 20% and not higher than 80%;
    an n-side electrode provided in a first region on the n-type clad layer;
    a first intermediate layer provided in a second region on the n-type clad layer different from the first region and made of an AlGaN-based semiconductor material that contains Si;
    a second intermediate layer provided on the first intermediate layer and made of an AlGaN-based semiconductor material having an Si concentration higher than that of the first intermediate layer and having a molar fraction of aluminum nitride (AlN) lower than that of the first intermediate layer;
    an active layer provided on the second intermediate layer and made of an AlGaN-based semiconductor material configure to emit deep ultraviolet light having a wavelength of 355 nm or shorter; and
    a p-type semiconductor layer provided on the active layer, wherein
    each of the first intermediate layer and the second intermediate layer includes AlN or AlGaN doped with Si,
    a distribution of an Si concentration in a direction in which the n-type clad layer, the first intermediate layer, the second intermediate layer, and the active layer are stacked has a local peak at least at a position of the second intermediate layer.

2. The semiconductor light emitting device according to claim 1, wherein
    a peak Si concentration in the second intermediate layer is higher than the Si concentration in the n-type clad layer.

3. The semiconductor light emitting device according to claim 1, wherein
    a peak Si concentration in the second intermediate layer is higher than the Si concentration in the active layer and lower than a maximum value of the Si concentration in the n-type clad layer.

4. The semiconductor light emitting device according to claim 1, wherein
    a peak Si concentration in the second intermediate layer is not lower than $8 \times 10^{18}/cm^3$ and not higher than $2.2 \times 10^{19}/cm^3$.

5. The semiconductor light emitting device according to claim 1, wherein
    an AlN molar fraction of the n-type clad layer is not lower than 40% and not higher than 70%, and
    the active layer is configured to emit light at a wavelength of not shorter than 240 nm and not longer than 310 nm.

6. A method of manufacturing a semiconductor light emitting device, comprising:
    forming, on a substrate, an n-type clad layer made of an n-type aluminum gallium nitride (AlGaN)-based semiconductor material containing silicon (Si) and having a molar fraction of aluminum nitride (AlN) of not lower than 20% and not higher than 80%;
    forming, on the n-type clad layer, a first intermediate layer made of an AlGaN-based semiconductor material that contains Si;
    forming, on the first intermediate layer, a second intermediate layer made of an AlGaN-based semiconductor material having an Si concentration higher than that of the first intermediate layer and having a molar fraction of aluminum nitride (AlN) lower than that of the first intermediate layer;
    forming, on the second intermediate layer, an active layer made of an AlGaN-based semiconductor material configure to emit deep ultraviolet light having a wavelength of 355 nm or shorter;
    forming a p-type semiconductor layer on the active layer;
    removing a portion of the p-type semiconductor layer, the active layer, the second intermediate layer, and the first intermediate layer to expose a partial region of the n-type clad layer; and forming an n-side electrode in the partial region on the n-type clad layer, wherein each of the first intermediate layer and the second intermediate layer includes AlN or AlGaN doped with Si, a substrate temperature in the forming of the first intermediate layer and the second intermediate layer is lower than a substrate temperature in the forming of the n-type clad layer.

* * * * *